_(12)_ United States Patent
Takaya et al.

(10) Patent No.: US 12,205,983 B2
(45) Date of Patent: Jan. 21, 2025

(54) SEMICONDUCTOR DEVICE AND MANUFACTURING METHOD OF SEMICONDUCTOR DEVICE

(71) Applicant: DENSO CORPORATION, Kariya (JP)

(72) Inventors: Hidefumi Takaya, Toyota (JP); Yuichi Takeuchi, Kariya (JP); Yukihiko Watanabe, Nagakute (JP)

(73) Assignee: DENSO CORPORATION, Kariya (JP)

( * ) Notice: Subject to any disclaimer, the term of this patent is extended or adjusted under 35 U.S.C. 154(b) by 448 days.

(21) Appl. No.: 17/546,248

(22) Filed: Dec. 9, 2021

(65) Prior Publication Data

US 2022/0102485 A1    Mar. 31, 2022

Related U.S. Application Data

(63) Continuation of application No. PCT/JP2020/013175, filed on Mar. 24, 2020.

(30) Foreign Application Priority Data

Jul. 8, 2019    (JP) ................. 2019-126893

(51) Int. Cl.
*H01L 29/06*    (2006.01)
*H01L 29/423*    (2006.01)
*H01L 29/66*    (2006.01)
*H01L 29/78*    (2006.01)

(52) U.S. Cl.
CPC ...... *H01L 29/0619* (2013.01); *H01L 29/4236* (2013.01); *H01L 29/66053* (2013.01); *H01L 29/7811* (2013.01); *H01L 29/7813* (2013.01)

(58) Field of Classification Search
CPC ............ H01L 29/7802; H01L 29/7811; H01L 29/7813; H01L 29/0623
See application file for complete search history.

(56) References Cited

U.S. PATENT DOCUMENTS

| | | | |
|---|---|---|---|
| 2012/0273875 A1* | 11/2012 | Yedinak | H01L 29/7813 438/270 |
| 2015/0084124 A1 | 3/2015 | Saito et al. | |
| 2016/0211319 A1 | 7/2016 | Saito et al. | |
| 2018/0151366 A1* | 5/2018 | Endo | H01L 29/7813 |

FOREIGN PATENT DOCUMENTS

| | | |
|---|---|---|
| JP | 2001-015744 A | 1/2001 |
| JP | 2001-274414 A | 10/2001 |
| JP | 2002-299622 A | 10/2002 |

* cited by examiner

*Primary Examiner* — Evan G Clinton
(74) *Attorney, Agent, or Firm* — Posz Law Group, PLC

(57) ABSTRACT

A semiconductor device includes a semiconductor substrate having an element region and a terminal region located around the element region. The terminal region includes multiple guard rings and multiple first diffusion regions. When the semiconductor substrate is viewed in a plan view, one of the first diffusion regions is arranged correspondingly to one of the guard rings, and each of the guard rings is located in corresponding one of the first diffusion regions. A width of each of the first diffusion regions is larger than a width of corresponding one of the guard rings.

6 Claims, 8 Drawing Sheets

SEMICONDUCTOR DEVICE AND MANUFACTURING METHOD OF SEMICONDUCTOR DEVICE

CROSS REFERENCE TO RELATED APPLICATIONS

The present application is a continuation application of International Patent Application No. PCT/JP2020/013175 filed on Mar. 24, 2020, which designated the U.S. and claims the benefit of priority from Japanese Patent Application No. 2019-126893 filed on Jul. 8, 2019. The entire disclosures of all of the above applications are incorporated herein by reference.

TECHNICAL FIELD

The present disclosure relates to a semiconductor device and a manufacturing method of a semiconductor device.

BACKGROUND

Conventionally, there has been known a semiconductor device including multiple guard rings and multiple diffusion regions.

SUMMARY

The present disclosure provides a semiconductor device and a manufacturing method of the semiconductor device. The semiconductor device includes a semiconductor substrate having an element region and a terminal region located around the element region. The terminal region includes multiple guard rings and multiple first diffusion regions. When the semiconductor substrate is viewed in a plan view, one of the first diffusion regions is arranged correspondingly to one of the guard rings, and each of the guard rings is located in corresponding one of the first diffusion regions. A width of each of the first diffusion regions is larger than a width of corresponding one of the guard rings.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
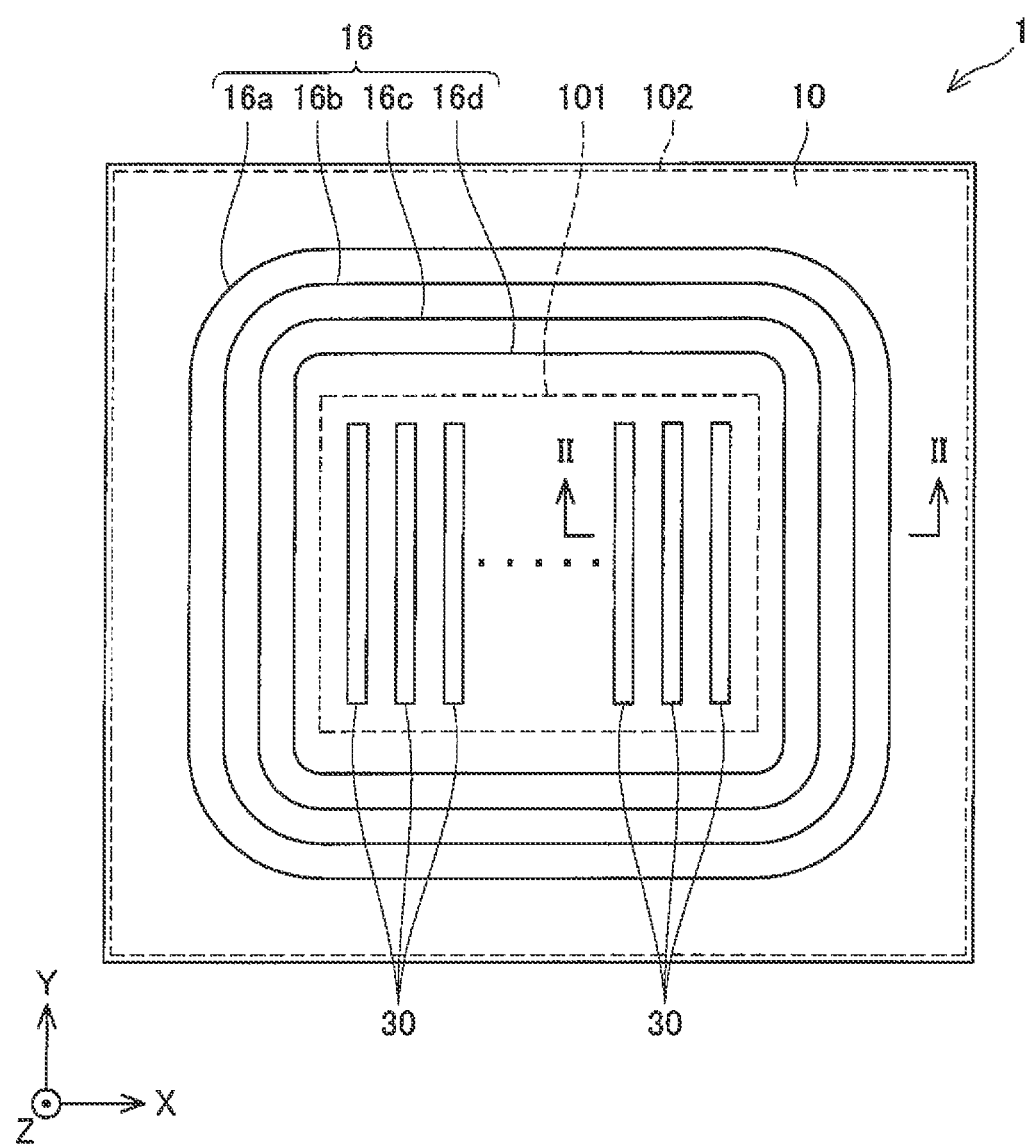
FIG. 1 is a diagram schematically showing a plan view of a semiconductor device according to an embodiment.

A semiconductor device according to a related art includes multiple p-type guard rings and multiple p-type diffusion regions disposed in a terminal region of a semiconductor substrate. Each of the guard rings is disposed at a position exposed on a surface of the semiconductor substrate, and is arranged so as to make a circuit around (i.e., goes around) an element region. Each of the diffusion regions is separated from the guard rings in a thickness direction of the semiconductor substrate, and is arranged so as to make a circuit around the element region.

When the semiconductor device is turned off, a depletion layer spreads from the element region to the terminal region. The depletion layer extends toward an outer peripheral side and a deep side of the terminal region via the guard rings and the diffusion regions. Due to the guard rings and the diffusion regions, the depletion layer spreading from the element region widely spreads toward the outer peripheral side and the deep side of the terminal region, and a breakdown voltage of the semiconductor device can be improved.

In this type of semiconductor device, it is desired to increase the breakdown voltage of the terminal region of the semiconductor substrate.

A semiconductor device according to an aspect of the present disclosure includes a semiconductor substrate having a first main surface and a second main surface opposite from each other, a first electrode disposed on the first main surface of the semiconductor substrate, and a second electrode disposed on the second main surface of the semiconductor substrate. The semiconductor substrate includes an element region in which a switching element structure is formed, and a terminal region located around the element region. The terminal region includes multiple guard rings of p-type disposed at positions exposed on the first main surface of the semiconductor substrate, and multiple first diffusion regions of p-type disposed at a first depth from the first main surface of the semiconductor substrate. Each of the guard rings makes a circuit around the element region. Each of the first diffusion regions is separated from the guard rings in a thickness direction of the semiconductor substrate, and makes a circuit around the element region. One of the first diffusion regions is arranged correspondingly to one of the guard rings when the semiconductor substrate is viewed in a plan view. Each of the guard rings is located in corresponding one of the first diffusion regions when the semiconductor substrate is viewed in the plan view. A width of each of the first diffusion regions is larger than a width of corresponding one of the guard rings.

In the above-described semiconductor device, the width of each of the first diffusion regions is larger than the width of the corresponding one of the guard rings. Therefore, a distance between adjacent two of the first diffusion regions is smaller than a distance between adjacent two of the guard rings. When the first diffusion regions are provided at such narrow intervals, a depletion layer that spreads from the element region toward the terminal region when the semiconductor device is turned off can spread widely toward the outer peripheral side and the deep side of the terminal region. Therefore, in the semiconductor device, the terminal region of the semiconductor substrate can have a high breakdown voltage.

A manufacturing method of a semiconductor device according to another aspect of the present disclosure includes preparing a semiconductor substrate including an element region for forming a switching element structure and a terminal region located around the element region, forming a mask on one main surface of the semiconductor substrate, the mask having multiple openings in a portion corresponding the terminal region, forming multiple guard rings of p-type at positions exposed on the one main surface of the semiconductor substrate by implanting p-type impurity ions through the mask, and forming multiple first diffusion regions at a first depth from the one main surface of the semiconductor substrate by implanting p-type impurity ions through the mask. Each of the guard rings makes a circuit around the element region. Each of the first diffusion regions is separated from the guard rings in a thickness direction of the semiconductor substrate and makes a circuit around the element region. One of the first diffusion regions is arranged correspondingly to one of the guard rings when the semiconductor substrate is viewed in a plan view. Each of the guard rings is located in corresponding one of the first diffusion regions when the semiconductor substrate is viewed in the plan view. A width of each of the first diffusion regions is larger than a width of corresponding one of the guard rings.

According to the above-described manufacturing method, the guard rings and the first diffusion regions can be formed using the common mask. Therefore, the above-described manufacturing method can manufacture the semiconductor device in which the terminal region has a high breakdown voltage at low cost.

Figure 2:
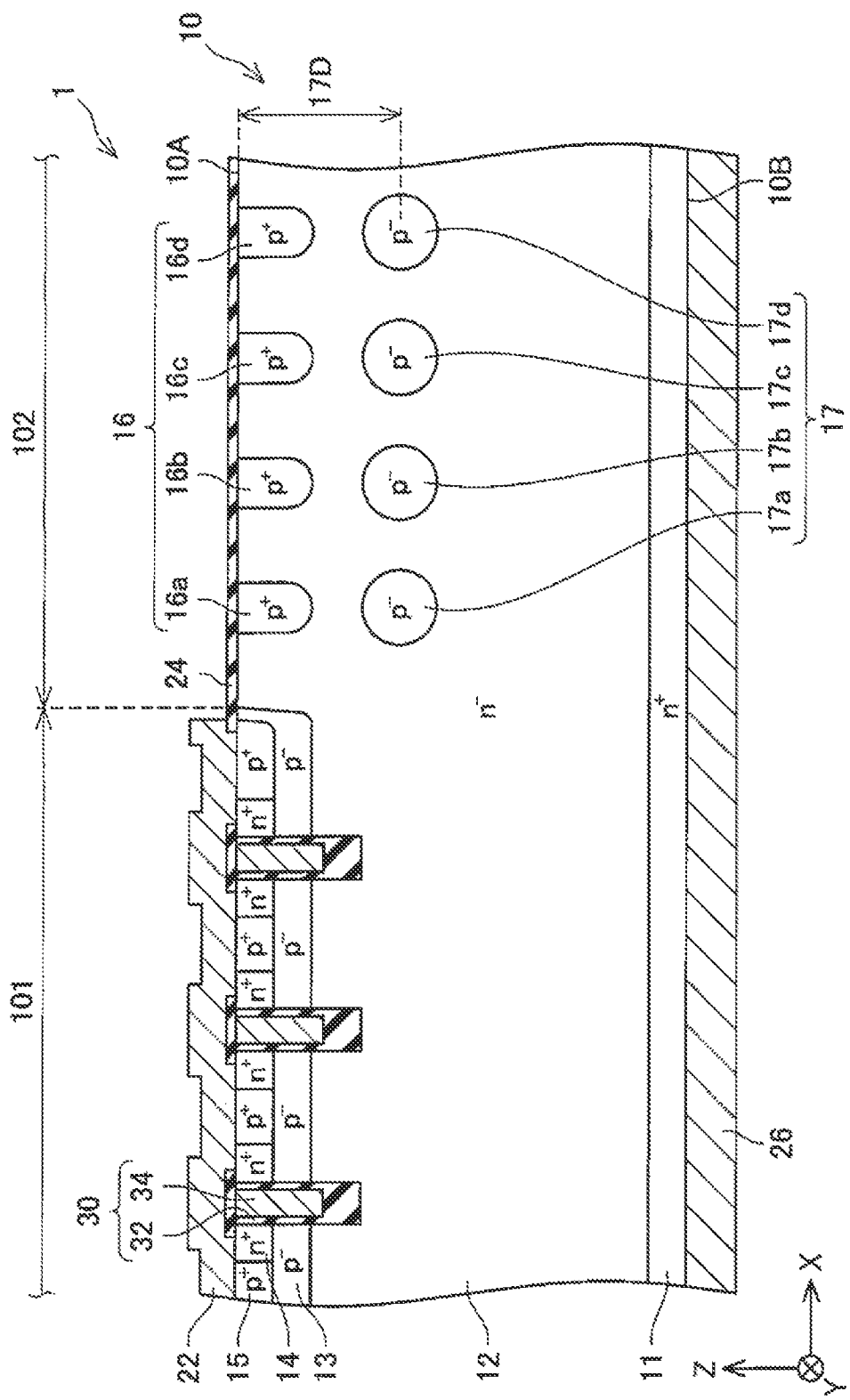
FIG. 2 is a diagram schematically showing a cross-sectional view of a main part of the semiconductor device taken along line II-II in FIG. 1.

As shown in FIG. 1 and FIG. 2, a semiconductor device 1 according to an embodiment of the present disclosure includes a semiconductor substrate 10, a source electrode 22 that covers a part of a front surface 10A of the semiconductor substrate 10, and an interlayer insulating film 24 that covers another part of the front surface 10A of the semiconductor substrate 10, a drain electrode 26 that covers the entire surface of a rear surface 10B of the semiconductor substrate 10, and multiple trench-type insulated gates 30. The semiconductor device 1 of the present embodiment is a vertical metal-oxide semiconductor field-effect transistor (MOSFET) and is adopted as a power semiconductor device. As shown in FIG. 2, the source electrode 22 and the interlayer insulating film 24 are disposed on the front surface 10A of the semiconductor substrate 10. However, these components are omitted in FIG. 1. The front surface 10A corresponds to a first main surface, and the rear surface 10B corresponds to a second main surface.

The semiconductor substrate 10 is a SiC substrate and has an element region 101 and a terminal region 102. As shown in FIG. 1, the element region 101 is arranged at a central portion of the semiconductor substrate 10 when viewed from a direction (Z direction) orthogonal to the front surface 10A of the semiconductor substrate 10 (hereinafter, referred to as "when the semiconductor substrate 10 is viewed in a plan view"). The element region 101 is defined in the semiconductor substrate 10 as a region where a switching element structure (MOSFET structure in this example) is formed. The terminal region 102 is a peripheral portion of the semiconductor substrate 10 and is located around the element region 101 when the semiconductor substrate 10 is viewed in the plan view. The terminal region 102 is defined in the semiconductor substrate 10 as a region where a terminal high breakdown voltage structure (multiple guard rings 16 and multiple first diffusion regions 17 in this example) is formed.

As shown in FIG. 2, the semiconductor substrate 10 has a drain region 11 of $n^+$-type, a drift region 12 of $n^-$-type, a body region 13 of $p^-$-type, multiple source regions 14 of $n^+$-type, multiple body contact regions 15 of $p^+$-type, the multiple guard rings 16 of $p^+$-type, and the multiple first diffusion regions 17 of $p^-$-type. In the present embodiment, the guard rings 16 include four guard rings 16a, 16b, 16c, 16d. However, the number of guard rings may also be other than four. Similarly, in the present embodiment, the first diffusion regions 17 include four first diffusion regions 17a, 17b, 17c, and 17d. However, the number of first diffusion regions may also be other than four. The body region 13, the source regions 14, and the body contact regions 15 are selectively formed in the element region 101. The guard rings 16 and the first diffusion regions 17 are selectively formed in the terminal region 102. As described above, in the present embodiment, a boundary between the element region 101 and the terminal region 102 is defined by a peripheral edge of the body region 13.

The drain region 11 is disposed at a rear layer portion of the semiconductor substrate 10 in both the element region 101 and the terminal region 102, and is disposed at a position exposed on the rear surface 10B of the semiconductor substrate 10. The drain region 11 is in ohmic contact with the drain electrode 26 that covers the rear surface 10B of the semiconductor substrate 10.

The drift region 12 is disposed on the drain region 11 in both the element region 101 and the terminal region 102. The drift region 12 is formed by crystal growth from a surface of the drain region 11 by using an epitaxial growth technique.

The body region 13 is disposed on the drift region 12 in the element region 101, and is disposed at the front layer portion of the semiconductor substrate 10. The body region 13 is formed by implanting p-type impurity (for example, aluminum or boron) ions into the front layer portion of the semiconductor substrate 10 by using an ion implantation technique.

The source region 14 is disposed on the body region 13 in the element region 101, and is disposed at a position exposed on the front surface 10A of the semiconductor substrate 10. The source region 14 is separated from the drift region 12 by the body region 13. The source region 14 is in ohmic contact with the source electrode 22 that covers the surface 10A of the semiconductor substrate 10. The source region 14 is formed by implanting n-type impurity (for example, nitrogen or the like) ions into the front layer portion of the semiconductor substrate 10 by using the ion implantation technique.

The body contact region 15 is disposed on the body region 13 in the element region 101, and is disposed at a position exposed on the front surface 10A of the semiconductor substrate 10. The body contact region 15 is in ohmic contact with the source electrode 22 that covers the front surface 10A of the semiconductor substrate 10. The body contact region 15 is formed by implanting p-type impurity (for example, aluminum or boron) ions into the front layer portion of the semiconductor substrate 10 by using the ion implantation technique.

As shown in FIG. 1, on the front surface 10A of the semiconductor substrate 10 in the range corresponding to the element region 101, the multiple trench-type insulated gates 30 are arranged in a stripe manner when the semiconductor substrate 10 is viewed in the plan view. Each of the trench-type insulated gates 30 extends along one direction (Y direction). As shown in FIG. 2, each of the trench-type insulated gates 30 has a silicon oxide gate insulating film 32 and a polysilicon gate electrode 34. The gate electrode 34 faces a portion of the body region 13 separating the drift region 12 and the source region 14 via the gate insulating film 32. As a result, the portion of the body region 13 separating the drift region 12 and the source region 14 can function as a channel region.

As described above, in the element region 101 of the semiconductor substrate 10, a MOSFET structure including the drain region 11, the drift region 12, the body region 13, the source regions 14, the body contact regions 15, and the trench-type insulated gates 30 is formed. On the other hand, in the terminal region 102 of the semiconductor substrate 10, a terminal high breakdown voltage structure including the guard rings 16 and the first diffusion regions 17 is formed.

The guard rings 16 are disposed on the drift region 12 in the terminal region 102, and are disposed at positions exposed on the front surface 10A of the semiconductor substrate 10. As shown in FIG. 1, each of the guard rings 16 is disposed so as to make a circuit around the element region 101, and has a similar figure concentric with the other guard rings 16. In this way, the guard rings 16 are laid out so that the individual guard rings repeatedly appear from the inner peripheral side to the outer peripheral side of the terminal region 102.

The first diffusion regions 17 are arranged in the drift region 12 in the terminal region 102, and are arranged in a plane having a predetermined depth 17D from the front surface 10A of the semiconductor substrate 10. Here, the depth 17D at which the first diffusion regions 17 are formed is defined as the depth at which the peak concentration of the p-type impurity ions contained in the first diffusion region 17 is located. The depth 17D at which the first diffusion regions 17 are formed is a position deeper than the bottom surface of the trench-type insulated gate 30. In this example, upper ends of the first diffusion regions 17 are also located deeper than the bottom surfaces of the trench-type insulated gates 30.

When the semiconductor substrate 10 is viewed in the plan view, one of the first diffusion regions 17 is arranged correspondingly to one of the guard rings 16. That is, one of the first diffusion regions 17 is arranged below one of the guard rings 16. Specifically, the first diffusion region 17a is arranged below the guard ring 16a, the first diffusion region 17b is arranged below the guard ring 16b, the first diffusion region 17c is arranged below the guard ring 16c, and the first diffusion region 17d is arranged below the guard ring 16d. Therefore, each of the first diffusion regions 17 is disposed so as to make a circuit around the element region 101 in the same manner as the guard rings 16, and has a similar figure concentric with the other first diffusion regions 17. In this way, the first diffusion regions 17 are also laid out so that the individual first diffusion regions 17 repeatedly appear from the inner peripheral side to the outer peripheral side of the terminal region 102.

Figure 3:
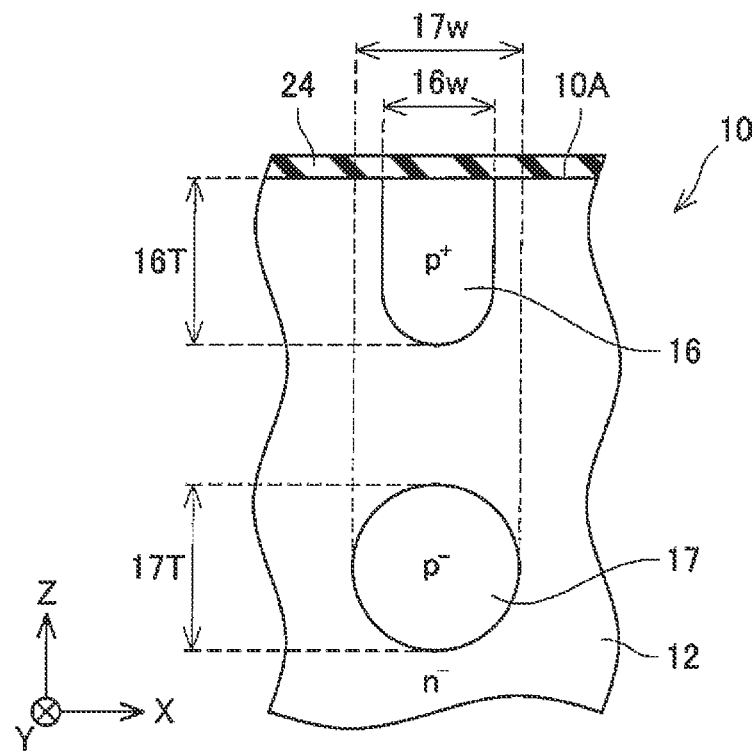
FIG. 3 is a diagram schematically showing an enlarged cross-sectional view of a part of a set of one guard ring and one first diffusion region.
Figure 4:
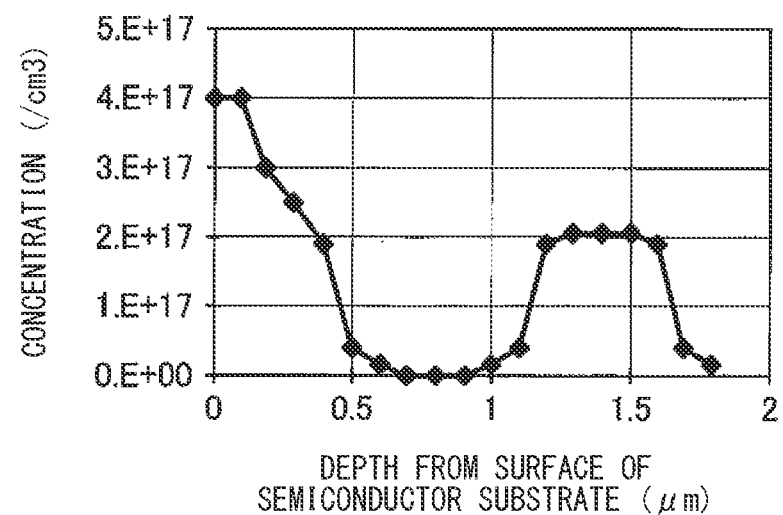
FIG. 4 is a graph showing a concentration profile of p-type impurity ions along a depth direction from a surface of a semiconductor substrate to a predetermined depth.

FIG. 3 shows an enlarged cross-sectional view of a main part of a set of the one guard ring 16 and the one first diffusion region 17. FIG. 4 shows a concentration profile of the p-type impurity ions along the depth direction from the front surface 10A of the semiconductor substrate 10 to the predetermined depth. The concentration profile of FIG. 4 is a concentration profile in a line passing through the center of the guard ring 16 in the width direction and the center of the first diffusion region 17 in the width direction along the depth direction. Here, the direction in which the guard rings 16 and the first diffusion regions 17 repeatedly appear (the direction from the inner peripheral side to the outer peripheral side of the terminal region 102) is defined as the width direction. In this example, the X direction is the width direction.

As described above, one of the first diffusion regions 17 is arranged correspondingly to one of the guard rings 16. More specifically, one of the first diffusion regions 17 is disposed below one of the guard rings 16 in such a manner that the center in the width direction of one the guard rings 16 and the center in the width direction of one of the first diffusion regions 17 coincide with each other in the thickness direction (Z direction) of the semiconductor substrate 10. Further, the width 16W of each of the guard rings 16 in the width direction is smaller than the width 17W of each of the first diffusion regions 17 in the width direction. Therefore, when the semiconductor substrate 10 is viewed in the plan view, each of the guard rings 16 is located in corresponding one of the first diffusion regions 17.

As shown in FIG. 4, the guard rings 16 are configured such that the peak of the p-type impurity concentration is located on the front surface 10A of the semiconductor substrate 10. As an example, the peak of the p-type impurity concentration in the guard rings 16 is about $4 \times 10^{17}$ cm$^{-3}$. Further, as an example, the guard rings 16 are formed from the front surface 10A of the semiconductor substrate 10 to a depth of about 0.5 µm, and the thickness 16T (see FIG. 3) of the guard rings 16 is about 0.5 µm.

As shown in FIG. 4, as an example, the first diffusion regions 17 are configured such that the peak of the p-type impurity concentration is located at a depth of about 1.4 µm from the front surface 10A of the semiconductor substrate 10. As an example, the peak of the p-type impurity concentration in the first diffusion regions 17 is about $2.5 \times 10^{17}$ cm$^{-3}$. Further, as an example, the first diffusion regions 17 are formed at depth from about 1.0 µm to about 1.8 µm, and the thickness 17T (see FIG. 3) of the first diffusion regions 17 is about 0.8 µm.

As shown in FIG. 4, the guard rings 16 and the first diffusion regions 17 are arranged apart from each other along the thickness direction of the semiconductor substrate 10. Further, the p-type impurity concentration in the first diffusion regions 17 is lower than the p-type impurity concentration in the guard rings 16.

Next, the operation of the semiconductor device 1 will be described. During operation of the semiconductor device 1, a potential higher than that of the source electrode 22 is applied to the drain electrode 26. When a potential higher than a threshold value is applied to the gate electrode 34, a channel is formed in the body region 13 in a range in contact with the gate insulating film 32. Then, electrons flow from the source electrode 22 to the drain electrode 26 via the source region 14, the channel, the drift region 12, and the drain region 11. On the other hand, when the potential of the gate electrode 34 is lowered below the threshold value, the channel disappears and the flow of electrons is stopped. In this way, in the semiconductor device 1, the current flowing between the source electrode 22 and the drain electrode 26 can be controlled based on the potential of the gate electrode 34.

When the semiconductor device 1 is turned off, a depletion layer spreads in the drift region 12 from a pn junction surface of the drift region 12 and the body region 13. In the drift region 12 of the element region 101, the depletion layer spreads from the front surface 10A toward the rear surface 10B. In the drift region 12 of the terminal region 102, the depletion layer spreads from the inner peripheral side to the outer peripheral side. When the depletion layer extending from the element region 101 reaches the guard ring 16a and the first diffusion region 17a on the innermost peripheral side, the depletion layer further extends from the guard ring 16a and the first diffusion region 17a toward the outer peripheral side. When the depletion layer extending from the guard ring 16a and the first diffusion region 17a on the innermost peripheral side reaches the guard ring 16b and the first diffusion region 17b that are the second from the inner peripheral side, the depletion layer further extends from the guard ring 16b and the first diffusion region 17b toward the outer peripheral side. In this way, in the terminal region 102, the depletion layer extends to the outer peripheral side while passing through the guard rings 16 and the first diffusion regions 17. That is, the guard rings 16 and the first diffusion regions 17 can promote the depletion layer widely spreading from the element region 101 toward the outer peripheral side and the deep side of the terminal region 102, and can improve the breakdown voltage of the semiconductor device 1.

Especially, in the semiconductor device 1, the width 17W of each of the first diffusion regions 17 is larger than the width 16W of corresponding one of the guard rings 16. Therefore, the width of the drift region 12 present between adjacent two of the first diffusion regions 17 is relatively narrow. By arranging the first diffusion regions 17 at narrow intervals in this way, when the semiconductor device 1 is turned off, the drift region 12 present between adjacent two of the first diffusion regions 17 is completely depleted. Further, in the semiconductor device 1, the p-type impurity concentration in the first diffusion regions 17 is lower than the p-type impurity concentration in the guard rings 16. Since the p-type impurity concentration in the first diffusion regions 17 is low, the first diffusion regions 17 are completely depleted when the semiconductor device 1 is turned off. Therefore, when the semiconductor device 1 is turned off, the drift region 12 present between adjacent two of the first diffusion regions 17 can be completely depleted, and the first diffusion regions 17 can be completely depleted, so that a region at the depth where the first diffusion regions 17 are disposed is completely depleted over a wide area. As a result, the electric field concentration in the terminal region 102 of the semiconductor substrate 10 is relaxed, and the breakdown voltage of the semiconductor device 1 is improved.

Further, as will be described later, the guard rings 16 and the first diffusion regions 17 are formed by using a common mask. Therefore, it can be evaluated that the semiconductor device 1 has a structure that has a high breakdown voltage and can be manufactured at low cost.

Next, a manufacturing method of the semiconductor device 1 will be described. Since this manufacturing method is characterized by processes of forming the guard rings 16 and the first diffusion regions 17, the processes of forming the guard rings 16 and the first diffusion regions 17 will be mainly described below, and the description of other processes will be omitted.

Figure 5:
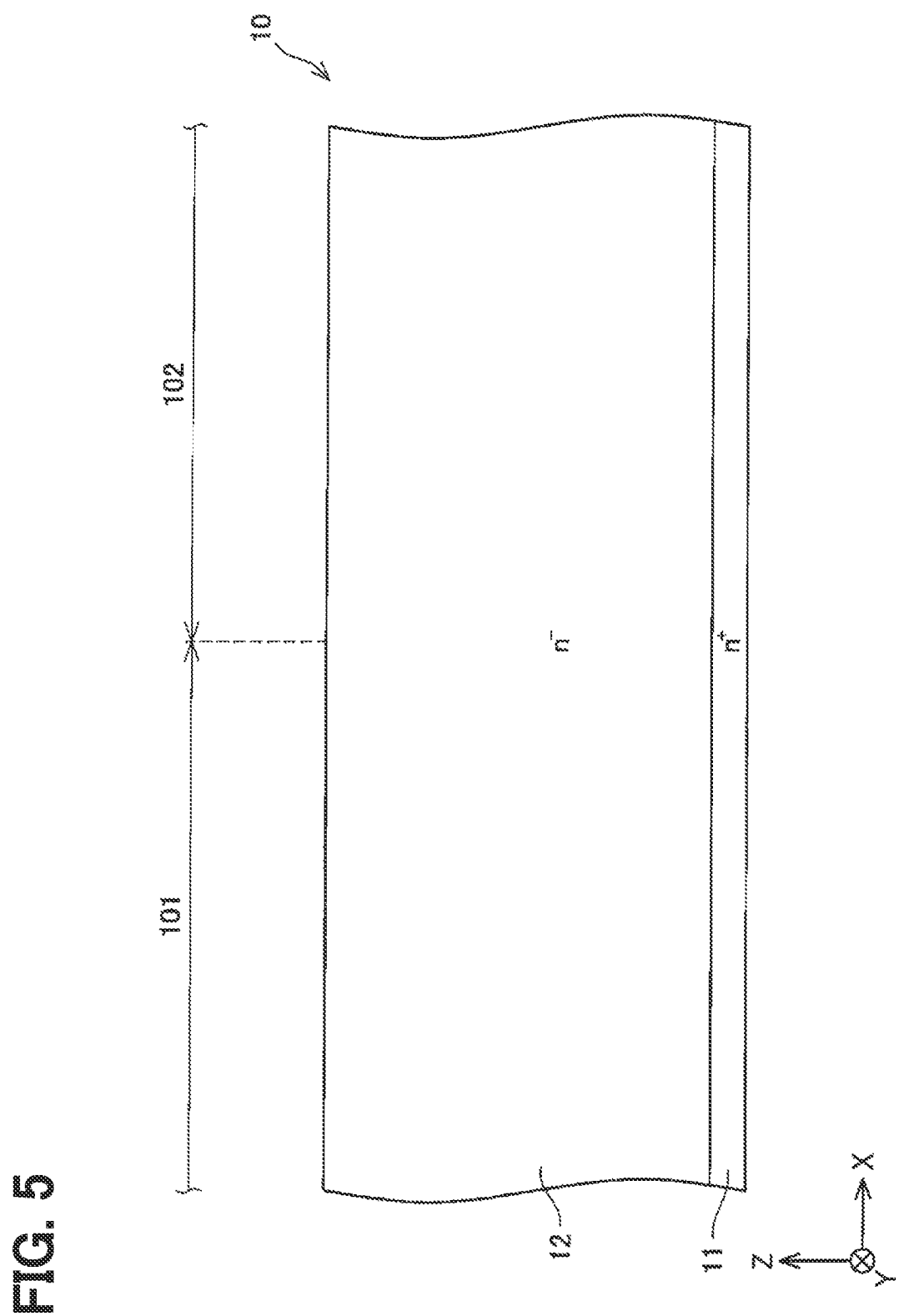
FIG. 5 is a diagram schematically showing a cross-sectional view of the main part in a process of manufacturing the semiconductor device shown in FIG. 1.

First, as shown in FIG. 5, the semiconductor substrate 10 of n-type is prepared. The semiconductor substrate 10 is formed by crystal growth of the drift region 12 from the surface of the drain region 11 by using the epitaxial growth technique. Although the surface structure of the element region 101 is not shown in this example, the surface structure of the element region 101 may be formed prior to the following processes.

Figure 6:
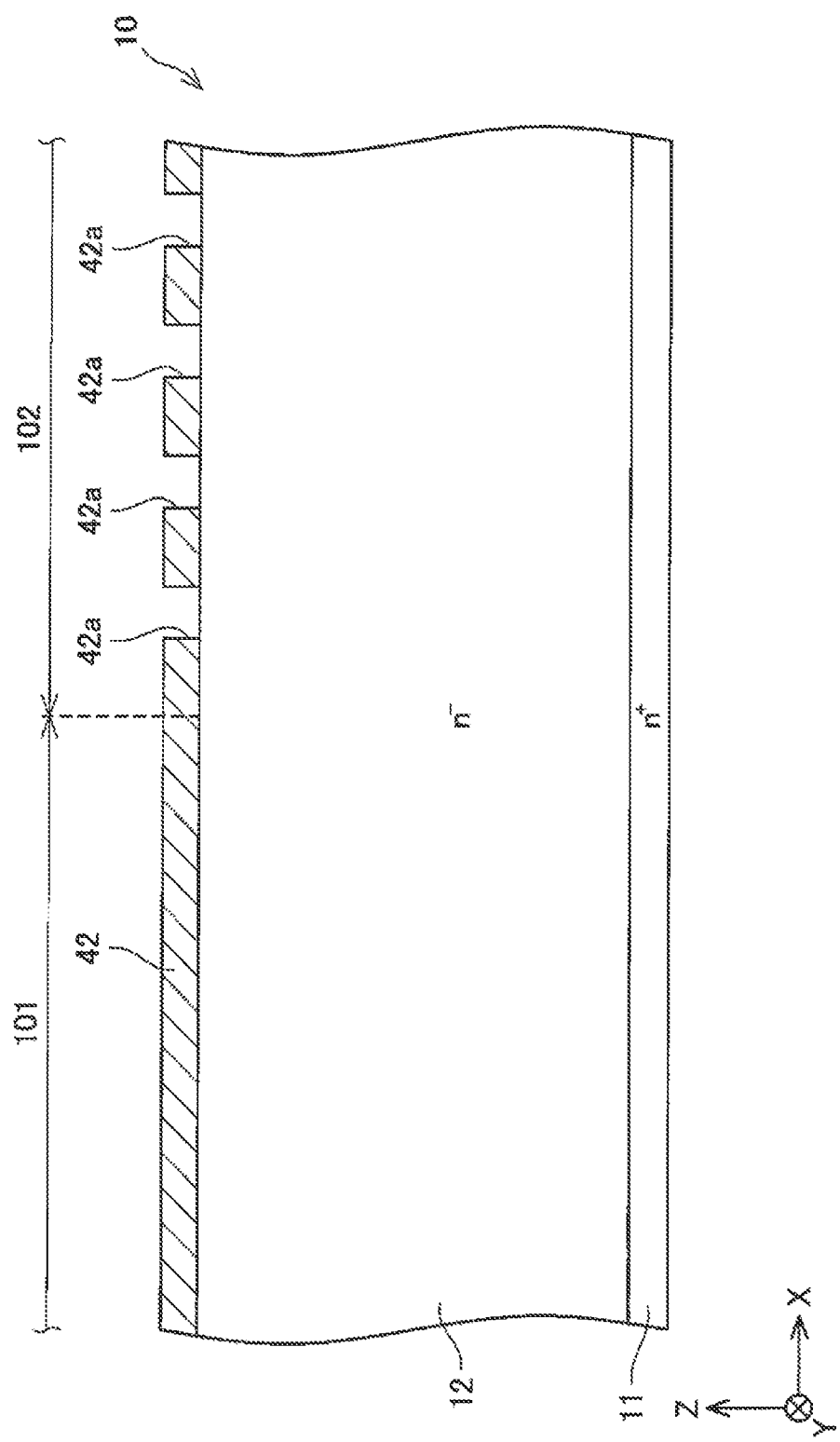
FIG. 6 is a diagram schematically showing a cross-sectional view of the main part in another process of manufacturing the semiconductor device shown in FIG. 1.

Next, as shown in FIG. 6, a mask 42 (for example, an oxide film or a resist) for ion implantation is formed on the front surface 10A of the semiconductor substrate 10. The mask 42 is formed with openings 42a at positions corresponding to the guard rings 16 and the first diffusion regions 17.

Figure 7:
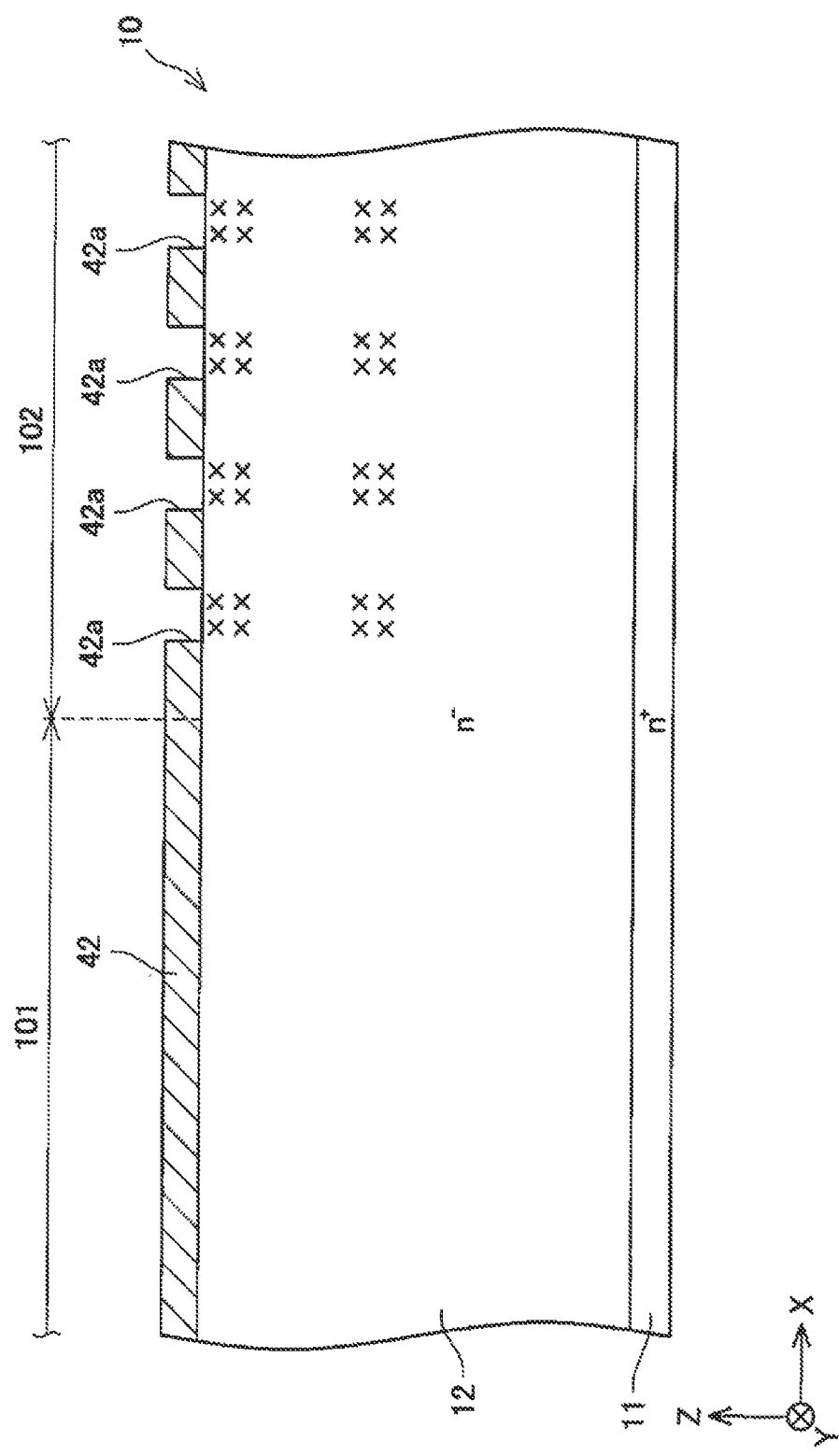
FIG. 7 is a diagram schematically showing a cross-sectional view of the main part in another process of manufacturing the semiconductor device shown in FIG. 1.

Next, as shown in FIG. 7, the ion implantation technique is used to implant p-type impurity (for example, aluminum or boron) ions into the semiconductor substrate 10 through the openings 42a of the mask 42. While changing the implantation energy of the p-type impurity ions (that is, the implantation depth of the impurity ions), the p-type impurity ions are implanted to portions in the vicinity of the front surface 10A corresponding to the formation positions of the guard rings 16 and portions inside the semiconductor substrate 10 corresponding to the formation positions of the first diffusion regions 17. In particular, by setting the implantation energy to 1200 KeV or more, the p-type impurity ions can be implanted into the formation positions of the first diffusion regions 17 (1.4 µm or more from the front surface 10A of the semiconductor substrate 10).

Figure 8:
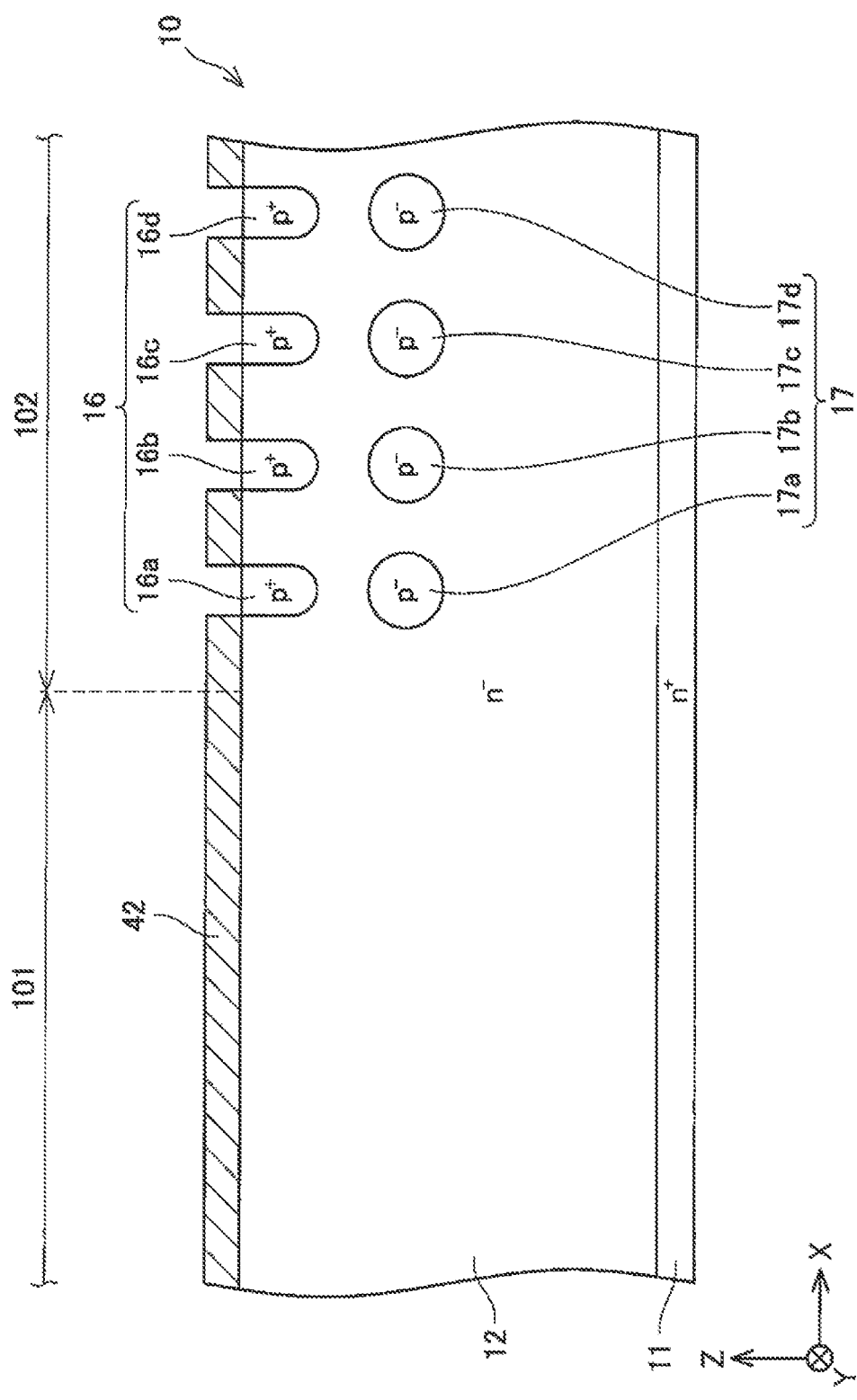
FIG. 8 is a diagram schematically showing a cross-sectional view of the main part in another process of manufacturing the semiconductor device shown in FIG. 1.

Next, as shown in FIG. 8, an annealing technique is used to activate the implanted p-type impurity ions to form the guard rings 16 and the first diffusion regions 17. Since the p-type impurity ions implanted to form the first diffusion regions 17 are implanted to deep positions of the semiconductor substrate 10, they are implanted while spreading due to divergence at the time of implantation. Therefore, each of the first diffusion regions 17 is wider than the corresponding one of the guard rings 16. Through these processes, the guard rings 16 and the first diffusion regions 17 can be formed.

As described above, according to the above manufacturing method, the guard rings 16 and the first diffusion regions 17 can be formed by using the common mask 42. According to the above manufacturing method, the semiconductor device 1 can be manufactured at low cost.

Figure 9:
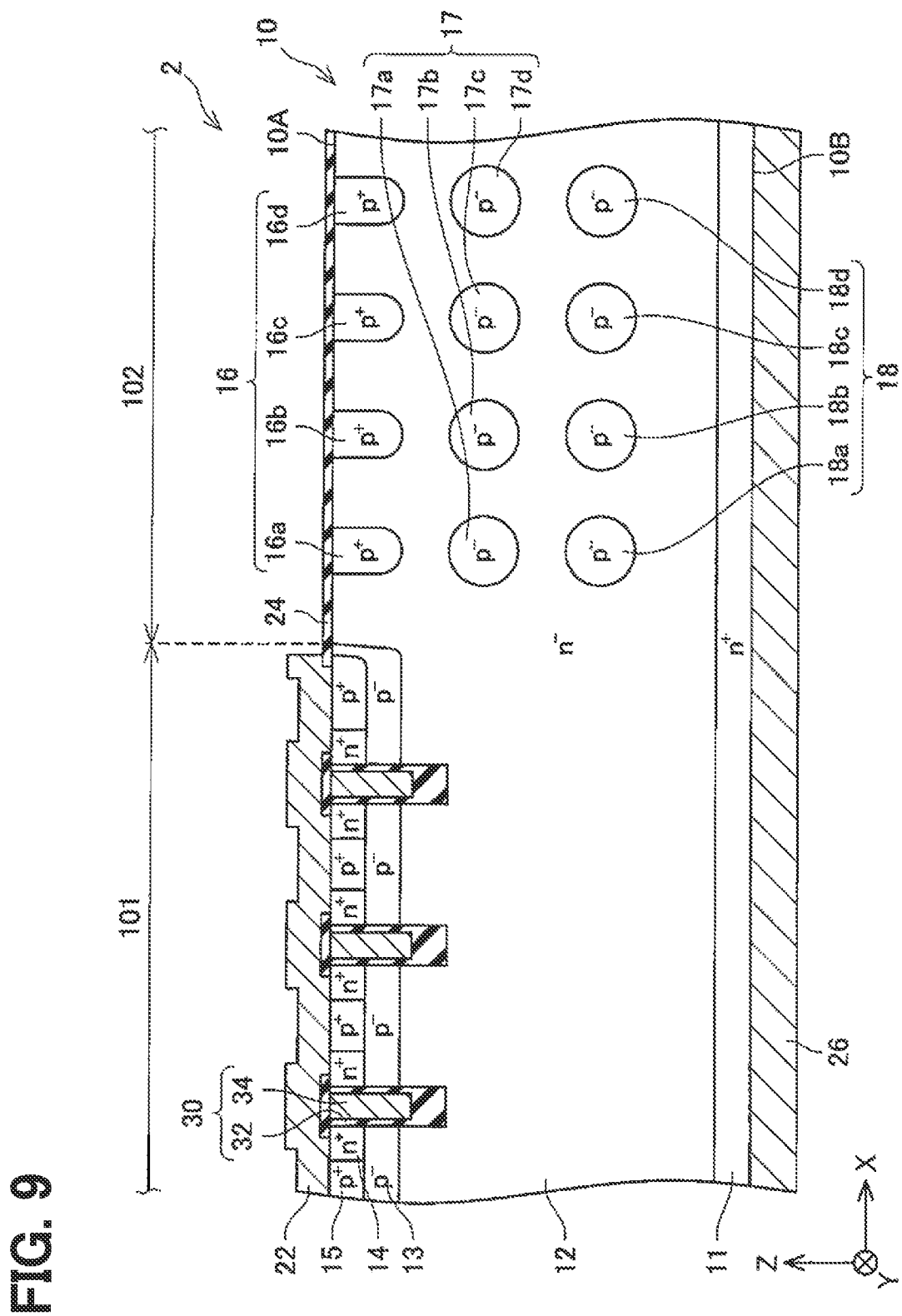
FIG. 9 is a diagram schematically showing a cross-sectional view of a main part of a semiconductor device according to a modification.

FIG. 9 shows a semiconductor device 2 according to a modification. The semiconductor device 2 is characterized by further including multiple second diffusion regions 18 as compared with the semiconductor device 1 shown in FIG. 1. As described above, the semiconductor device 2 is characterized by including the first diffusion regions 17 and the second diffusion regions 18 in two stages. In the present embodiment, the second diffusion regions 18 include four second diffusion regions 18a, 18b, 18c, and 18d. However, the number of second diffusion regions may also be other than four.

The second diffusion regions 18 are disposed in the drift region 12 in the terminal region 102, and are disposed at positions deeper than the first diffusion regions 17. Here, the definition of the depth at which the second diffusion regions 18 are formed is the same as that of the first diffusion regions 17. Each of the second diffusion regions 18 is separated from corresponding one of the first diffusion regions 17. Further, a p-type impurity concentration in the second diffusion regions 18 is lower than the p-type impurity concentration in the guard rings 16. The p-type impurity concentration in the second diffusion regions 18 may be the same as, higher than, or lower than the p-type impurity concentration in the first diffusion regions 17.

When the semiconductor substrate 10 is viewed in the plan view, one of the second diffusion regions 18 is arranged correspondingly to one of the guard rings 16. That is, each of the second diffusion region 18 is arranged below corresponding one of the guard rings 16. Specifically, the second diffusion region 18a is arranged below the guard ring 16a, the second diffusion region 18b is arranged below the guard ring 16b, the second diffusion region 18c is arranged below the guard ring 16c, and the second diffusion region 18d is arranged below the guard ring 16d. Therefore, each of the second diffusion regions 18 is disposed so as to make a circuit around the element region 101 in the same manner as the guard rings 16 and the first diffusion regions 17, and has a similar figure concentric with the other second diffusion regions 18. In this way, the second diffusion regions 18 are also laid out so that the individual second diffusion regions 18 repeatedly appear from the inner peripheral side to the outer peripheral side of the terminal region 102.

As described above, one of the second diffusion regions 18 is arranged correspondingly to one of the guard rings 16. More specifically, one of the second diffusion regions 18 is disposed below one of the guard rings 16 in such a manner that the center in the width direction of one the guard rings 16 and the center in the width direction of one of the second diffusion regions 18 coincide with each other in the thickness direction (Z direction) of the semiconductor substrate 10. Further, the width of each of the second diffusion regions 18 in the width direction is larger than the width of the corresponding one of the guard rings 16 in the width direction. The width of each of the second diffusion regions 18 in the width direction may be the same as, larger than, or smaller than the width of the corresponding one of the first diffusion regions 17 in the width direction.

In the semiconductor device 2, since the second diffusion regions 18 are provided, the depletion layer spreading from the element region 101 is promoted to spread further toward the outer peripheral side and the deep side of the terminal region 102. Therefore, the breakdown voltage of the semiconductor device 2 can be improved. Although the semiconductor device 2 includes the first diffusion regions 17 and the second diffusion regions 18 in two stages, the semiconductor device 2 may include diffusion regions in multiple stages larger than two.

The second diffusion regions 18 can be formed at the same time as the guard rings 16 and the first diffusion regions 17. That is, when p-type impurity ions are implanted as shown in FIG. 7, the implantation energy of the p-type impurity ions may be changed and the p-type impurity ions may be implanted inside the semiconductor substrate 10 corresponding to the formation positions of the second diffusion regions 18. In this way, the guard rings 16, the first diffusion regions 17, and the second diffusion regions 18 can be formed by using the common mask 42. Therefore, it can be evaluated that the semiconductor device 2 has a structure that has a high breakdown voltage and can be manufactured at low cost.

The technical elements disclosed herein are listed below. The following technical elements are useful independently.

A semiconductor device disclosed in the present disclosure includes a semiconductor substrate having a first main surface and a second main surface opposite from each other, a first electrode disposed on the first main surface of the semiconductor substrate, and a second electrode disposed on the second main surface of the semiconductor substrate. The material of the semiconductor substrate is not particularly limited, but may be, for example, a SiC substrate. The semiconductor substrate may have an element region in which a switching element structure is formed and a terminal region located around the element region. Here, various types of switching element structures can be adopted. Examples of the switching element structure include a MOSFET structure and an IGBT structure. The terminal region includes multiple guard rings of p-type disposed at positions exposed on the first main surface of the semiconductor substrate and multiple first diffusion regions disposed at a first depth from the first main surface of the semiconductor substrate. Each of the guard rings makes a circuit according the element region. Each of the first diffusion regions is separated from the guard rings in the thickness direction of the semiconductor substrate and makes a circuit around the element region. When the semiconductor substrate is viewed in a plan view, one of the first diffusion regions is arranged correspondingly to one of the guard rings. When the semiconductor substrate is viewed in the plan view, each of the guard rings is located in corresponding one of the first diffusion regions. A width of each of the first diffusion regions is larger than a width of corresponding one of the guard rings.

In the semiconductor device, a p-type impurity concentration in the first diffusion regions may be lower than a p-type impurity concentration in the guard rings. Accordingly, when the semiconductor device is turned off, the first diffusion regions can be satisfactorily depleted.

In the semiconductor device, the switching element structure may have a trench-type insulated gate disposed on the first main surface of the semiconductor substrate. In this case, the first depth may be deeper than a bottom surface of the trench-type insulated gate.

In the semiconductor device, the terminal region may further include multiple second diffusion regions of p-type. The second diffusion regions are disposed at a second depth deeper than the first depth from the first main surface of the semiconductor substrate. Each of the second diffusion regions is separated from the first diffusion regions in the thickness direction of the semiconductor substrate and makes a circuit around the element region. In this case, when the semiconductor substrate is viewed in the plan view, one of the second diffusion regions is arranged correspondingly to one of the guard rings. When the semiconductor substrate is viewed in the plan view, each of the guard rings is located in corresponding one of the second diffusion regions. A width of each of the second diffusion regions is larger than the width of corresponding one of the guard rings. In this semiconductor device, the terminal region of the semiconductor substrate can have a higher breakdown voltage.

In the semiconductor device, a concentration of a p-type impurity in the second diffusion regions may be lower than the concentration of the p-type impurity in the guard rings. Accordingly, when the semiconductor device is turned off, the second diffusion regions can be satisfactorily depleted.

A manufacturing method of a semiconductor device disclosed in the present disclosure includes preparing a semiconductor substrate, forming a mask, forming multiple guard rings, and forming multiple first diffusion regions. The material of the semiconductor substrate is not particularly limited, but may be, for example, a SiC substrate. In the preparing of the semiconductor substrate, the semiconductor substrate including an element region for forming a switching element structure and a terminal region located around the element region is prepared. Here, various types of switching element structures can be adopted. Examples of the switching element structure include a MOSFET structure and an IGBT structure. Further, the switching element structure may be formed in the element region in the preparing of the semiconductor substrate, or the switching element structure may be formed in the element region after the following processes are performed. In the forming of the mask, the mask is formed on one main surface of the semiconductor substrate. The mask has openings at predetermined positions in a portion corresponding to the terminal region. In the forming of the multiple guard rings, p-type impurity ions are implanted through the mask to form the multiple guard rings of p type at positions exposed on the one main surface of the semiconductor substrate. In the forming of the multiple first diffusion regions, p-type impurity ions are implanted through the mask to form the multiple first diffusion regions at a first depth from the one main surface of the semiconductor substrate. Each of the guard rings makes a circuit around the element region. Each of the first diffusion regions is separated from the guard rings in the thickness direction of the semiconductor substrate and makes a circuit around the element region. When the semiconductor substrate is viewed in a plan view, one of the first diffusion regions is arranged correspondingly to one of the guard rings. When the semiconductor substrate is viewed in the plan view, each of the guard rings is located in corresponding one of the first diffusion regions. A width of each of the first diffusion regions is larger than a width of corresponding one of the guard rings.

In the above-described manufacturing method, a p-type impurity concentration in the first diffusion regions may be lower than a p-type impurity concentration in the guard rings.

In the above-described manufacturing method, the switching element structure may have a trench-type insulated gate disposed on the one main surface of the semiconductor substrate. In this case, the first depth may be deeper than a bottom surface of the trench-type insulated gate.

The above-described manufacturing method may further include forming multiple second diffusion regions. In the forming of the multiple second diffusion regions, p-type impurity ions are implanted through the mask to form the multiple second diffusion regions at a second depth deeper than the first depth from the one main surface of the semiconductor substrate. Each of the second diffusion regions is separated from the first diffusion regions in the thickness direction of the semiconductor substrate and makes a circuit around the element region. When the semiconductor substrate is viewed in the plan view, one of the second diffusion regions is arranged correspondingly to one of the guard rings. When the semiconductor substrate is viewed in the plan view, each of the guard rings is located in the corresponding one of the second diffusion regions. A width of each of the second diffusion regions is larger than the width of the corresponding one of the guard rings.

In the above-described manufacturing method, a p-type impurity concentration in the second diffusion regions may be lower than the p-type impurity concentration in the guard rings.

Although the embodiments have been described in detail above, these are merely examples and do not limit the scope of claims. The techniques described in the claims include various modifications of the specific examples illustrated above. The technical elements described in the present disclosure or the drawings exhibit technical usefulness alone or in various combinations, and are not limited to the combinations described in the claims at the time of filing. In addition, the techniques illustrated in the present disclosure or drawings achieve multiple objectives at the same time, and achieving one of the objectives itself has technical usefulness.

What is claimed is:

1. A semiconductor device comprising:
    a semiconductor substrate having a first main surface and a second main surface opposite from each other;
    a first electrode disposed on the first main surface of the semiconductor substrate; and
    a second electrode disposed on the second main surface of the semiconductor substrate, wherein
    the semiconductor substrate includes:
        an element region in which a switching element structure is formed, and
        a terminal region located around the element region,
    the terminal region includes:
        a plurality of guard rings of p-type disposed at a plurality of positions exposed on the first main surface of the semiconductor substrate, each of the plurality of guard rings making a circuit around the element region, and
        a plurality of first diffusion regions of p-type disposed at a first depth from the first main surface of the semiconductor substrate, each of the plurality of first diffusion regions being separated from the plurality of guard rings in a thickness direction of the semiconductor substrate, and making a circuit around the element region,
    one of the plurality of first diffusion regions is arranged correspondingly to one of the plurality of guard rings when the semiconductor substrate is viewed in a plan view,
    each of the plurality of guard rings is located in corresponding one of the plurality of first diffusion regions when the semiconductor substrate is viewed in the plan view, and
    a width of each of the plurality of first diffusion regions is larger than a width of corresponding one of the plurality of guard rings, wherein
    the switching element structure includes a trench-type insulated gate disposed on the first main surface of the semiconductor substrate,
    the first depth is deeper than a bottom surface of the trench-type insulated gate, and
    a lower end of each of the plurality of guard rings is located above the bottom surface of the trench-type insulated gate.

2. The semiconductor device according to claim 1, wherein
    a p-type impurity concentration in the plurality of first diffusion regions is lower than a p-type impurity concentration in the plurality of guard rings.

3. The semiconductor device according to claim 1, wherein
    the terminal region further includes a plurality of second diffusion regions of p-type disposed at a second depth deeper than the first depth from the first main surface of the semiconductor substrate,
    each of the plurality of second diffusion regions is separated from the plurality of first diffusion regions in the thickness direction of the semiconductor substrate, and makes a circuit around the element region,
    one of the plurality of second diffusion regions is arranged correspondingly to one of the plurality of guard rings when the semiconductor substrate is viewed in the plan view,
    each of the plurality of guard rings is located in corresponding one of the plurality of second diffusion regions when the semiconductor substrate is viewed in the plan view, and a width of each of the plurality second diffusion regions is larger than the width of corresponding one of the plurality of guard rings.

4. The semiconductor device according to claim 3, wherein
a p-type impurity concentration in the plurality of second diffusion regions is lower than a p-type impurity concentration in the plurality of guard rings.

5. The semiconductor device according to claim 1, wherein
the semiconductor substrate is a SiC substrate.

6. The semiconductor device according to claim 1, wherein
a thickness of each of the plurality of first diffusion regions in the thickness direction of the semiconductor substrate is larger than a thickness of the corresponding one of the plurality of guard rings in the thickness direction of the semiconductor substrate.

* * * * *